United States Patent
Saito

(10) Patent No.: US 7,859,052 B2
(45) Date of Patent: Dec. 28, 2010

(54) SEMICONDUCTOR APPARATUS

(75) Inventor: Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 12/019,228

(22) Filed: Jan. 24, 2008

(65) Prior Publication Data

US 2008/0211020 A1  Sep. 4, 2008

(30) Foreign Application Priority Data

Jan. 25, 2007  (JP) .............................. 2007-014437

(51) Int. Cl.
H01L 29/66 (2006.01)
H01L 29/78 (2006.01)

(52) U.S. Cl. ...................... 257/341; 257/328; 257/330; 257/342; 257/E29.262

(58) Field of Classification Search .......... 257/328–342
See application file for complete search history.

(56) References Cited

U.S. PATENT DOCUMENTS

| | | | |
|---|---|---|---|
| 5,216,275 | A | 6/1993 | Chen |
| 6,677,626 | B1 | 1/2004 | Shindou et al. |
| 6,693,338 | B2 | 2/2004 | Saitoh et al. |
| 2005/0017292 | A1 | 1/2005 | Onishi et al. |
| 2005/0242411 | A1* | 11/2005 | Tso ............................ 257/480 |
| 2005/0280086 | A1* | 12/2005 | Saito et al. .................. 257/341 |
| 2006/0124997 | A1 | 6/2006 | Yamauchi et al. |
| 2006/0157813 | A1 | 7/2006 | Saito et al. |
| 2006/0197152 | A1 | 9/2006 | Tokano et al. |

FOREIGN PATENT DOCUMENTS

| | | |
|---|---|---|
| JP | 2001-127289 | 5/2001 |
| JP | 2004-273742 | 9/2004 |

* cited by examiner

*Primary Examiner*—N Drew Richards
*Assistant Examiner*—Mamadou Diallo
(74) *Attorney, Agent, or Firm*—Oblon, Spivak, McClelland, Maier & Neustadt, L.L.P.

(57) ABSTRACT

A semiconductor apparatus includes: a first first-conductivity-type semiconductor layer; a second first-conductivity-type semiconductor layer provided on a major surface of the first first-conductivity-type semiconductor layer; a third second-conductivity-type semiconductor layer forming a periodic array structure in combination with the second first-conductivity-type semiconductor layer in a lateral direction generally parallel to the major surface of the first first-conductivity-type semiconductor layer; and a sixth first-conductivity-type semiconductor layer provided on the major surface of the first first-conductivity-type semiconductor layer in a termination section outside the periodic array structure. The second first-conductivity-type semiconductor layer has an impurity concentration varying in the lateral direction and the impurity concentration is minimized at a center in the lateral direction. An impurity concentration in the sixth first-conductivity-type semiconductor layer is not higher than the impurity concentration at the center of the second first-conductivity-type semiconductor layer.

14 Claims, 12 Drawing Sheets

SEMICONDUCTOR APPARATUS

CROSS-REFERENCE TO RELATED APPLICATIONS

This application is based upon and claims the benefit of priority from the prior Japanese Patent Application No. 2007-014437, filed on Jan. 25, 2007; the entire contents of which are incorporated herein by reference.

BACKGROUND OF THE INVENTION

1. Field of the Invention

This invention relates to a semiconductor apparatus, and more particularly to a vertical semiconductor apparatus suitable for power electronics applications.

2. Background Art

The ON resistance of a vertical power MOSFET (metal-oxide-semiconductor field effect transistor) greatly depends on the electric resistance of its conduction layer (drift layer). The dopant concentration that determines the electric resistance of the drift layer cannot exceed a maximum limit, which depends on the breakdown voltage of a pn junction between the base and the drift layer. Thus there is a tradeoff between the device breakdown voltage and the ON resistance. Improving this tradeoff is important for low power consumption devices. This tradeoff has a limit determined by the device material. Overcoming this limit is the way to realizing devices with low ON resistance beyond existing power devices.

As an example MOSFET to solve this problem, a structure with p-type pillar layers and n-type pillar layers buried in the drift layer is known as a super-junction structure. In the super-junction structure, a non-doped layer is artificially produced by equalizing the amount of charge (amount of impurities) contained in the p-type pillar layer with that contained in the n-type pillar layer. Thus, while holding a high breakdown voltage, a current is passed through the highly doped n-type pillar layer. Hence a low ON resistance beyond the material limit is realized.

Thus the super-junction structure can be used to realize an ON resistance/breakdown voltage tradeoff beyond the material limit. However, such an improved tradeoff requires formation of a thick super-junction structure having a narrow lateral pitch (pillar layers having a high aspect ratio).

Pillar layers having a high aspect ratio can be formed by forming a trench and then filling in the trench by crystal growth (e.g., JP-A 2004-273742 (Kokai)). In this method, a super-junction structure is formed by forming a plurality of periodic trenches in an n-type semiconductor layer and filling in the trenches with a p-type semiconductor layer. However, if a super-junction structure is thus formed, an identical super-junction structure is formed both in the cell section for passing a current and in the termination section located outside the cell section. To the termination section, voltage is applied both vertically and laterally. Hence electric field concentration is likely to occur therein, and the termination breakdown voltage tends to be lower than the cell breakdown voltage.

If the termination breakdown voltage is lower than the cell breakdown voltage, avalanche breakdown occurs only in the termination section upon application of high voltage. Hence a termination section having a small area cannot pass a large avalanche current, resulting in destroying the device. That is, a high avalanche withstand capability cannot be obtained. Thus, in order to obtain a high avalanche withstand capability by setting the termination breakdown voltage to be higher than the cell breakdown voltage, it is effective to form different super-junction structures in the cell section and in the termination section, or not to form a super-junction structure in the termination section.

SUMMARY OF THE INVENTION

According to an aspect of the invention, there is provided a semiconductor apparatus including: a first first-conductivity-type semiconductor layer; a second first-conductivity-type semiconductor layer provided on a major surface of the first first-conductivity-type semiconductor layer; a third second-conductivity-type semiconductor layer being adjacent to the second first-conductivity-type semiconductor layer, provided on the major surface of the first first-conductivity-type semiconductor layer, and forming a periodic array structure in combination with the second first-conductivity-type semiconductor layer in a lateral direction generally parallel to the major surface of the first first-conductivity-type semiconductor layer; a first main electrode electrically connected to the first first-conductivity-type semiconductor layer; a fourth second-conductivity-type semiconductor region provided on the third second-conductivity-type semiconductor layer; a fifth first-conductivity-type semiconductor region selectively provided in a surface of the fourth second-conductivity-type semiconductor region; a second main electrode provided in contact with the fifth first-conductivity-type semiconductor region and the fourth second-conductivity-type semiconductor region; a control electrode provided on the fifth first-conductivity-type semiconductor region, the fourth second-conductivity-type semiconductor region, and the second first-conductivity-type semiconductor layer via an insulating film; and a sixth first-conductivity-type semiconductor layer provided on the major surface of the first first-conductivity-type semiconductor layer in a termination section outside the periodic array structure of the second first-conductivity-type semiconductor layer and the third second-conductivity-type semiconductor layer, the second first-conductivity-type semiconductor layer having an impurity concentration varying in the lateral direction, the impurity concentration being minimized at a center in the lateral direction, and an impurity concentration in the sixth first-conductivity-type semiconductor layer being not higher than the impurity concentration at the center of the second first-conductivity-type semiconductor layer.

According to another aspect of the invention, there is provided a semiconductor apparatus including: a first first-conductivity-type semiconductor layer; a second first-conductivity-type semiconductor layer provided on a major surface of the first first-conductivity-type semiconductor layer; a third second-conductivity-type semiconductor layer being adjacent to the second first-conductivity-type semiconductor layer, provided on the major surface of the first first-conductivity-type semiconductor layer, and forming a periodic array structure in combination with the second first-conductivity-type semiconductor layer in a lateral direction generally parallel to the major surface of the first first-conductivity-type semiconductor layer; a first main electrode electrically connected to the first first-conductivity-type semiconductor layer; a fourth second-conductivity-type semiconductor region provided on the third second-conductivity-type semiconductor layer; a fifth first-conductivity-type semiconductor region selectively provided in a surface of the fourth second-conductivity-type semiconductor region; a second main electrode provided in contact with the fifth first-conductivity-type semiconductor region and the fourth second-conductivity-type semiconductor region; a control electrode provided on the fifth first-conductivity-type semiconductor region, the fourth second-conductivity-type semiconductor region, and the second first-conductivity-type semiconductor layer via an insulating film; and a sixth first-conductivity-type semiconductor layer provided on the major surface of the first first-conductivity-type semiconductor layer in a termination section outside the periodic array structure of the second first-conductivity-type semiconductor layer and the third second-conductivity-type semiconductor layer, the second first-conductivity-type semiconductor layer having a first portion with a lower impurity concentration, and second portions with a higher impurity concentration, the second portions being provided on both sides of the first portion in the lateral direction, and an impurity concentration in the sixth first-conductivity-type semiconductor layer being not higher than the impurity concentration at the first portion of the second first-conductivity-type semiconductor layer.

DETAILED DESCRIPTION OF THE INVENTION

Figure 1:
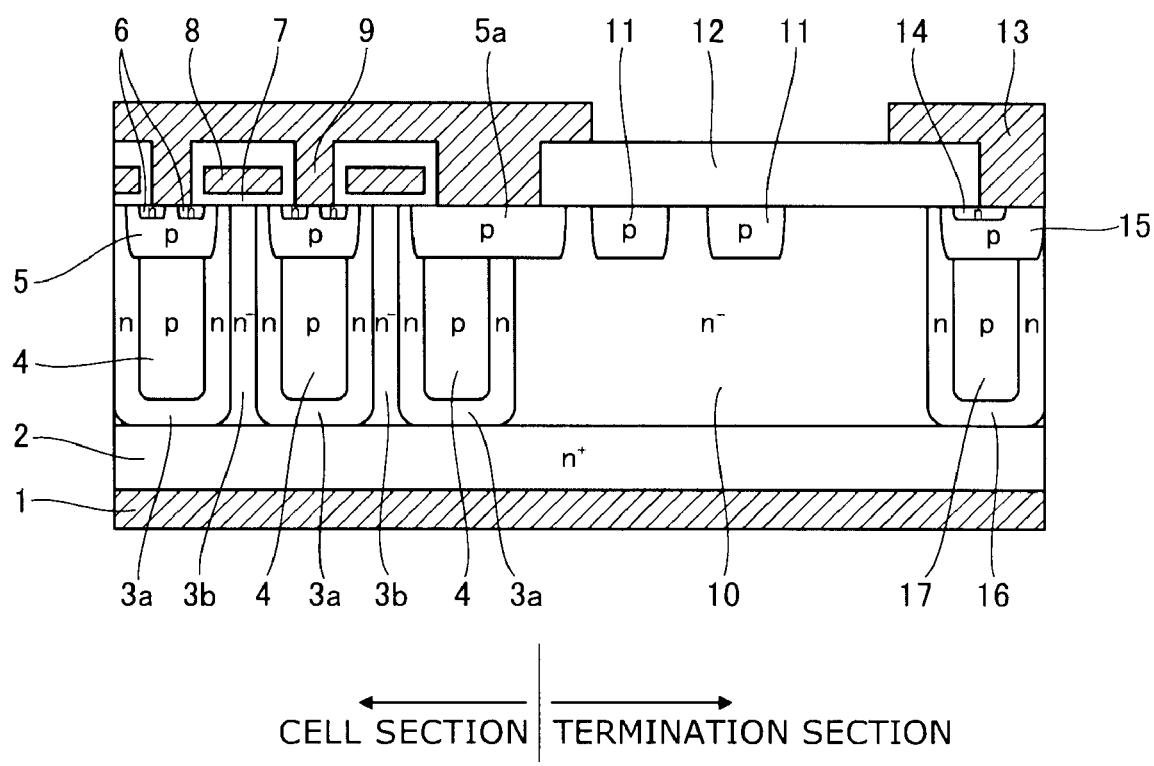
FIG. 1 is a cross-sectional view schematically showing the configuration of a semiconductor apparatus according to a first embodiment of the invention.

The semiconductor apparatus according to embodiments of the invention will now be described with reference to the drawings, taking a power MOSFET as an example. In the following embodiments, it is assumed that the first conductivity type and the second conductivity type are n-type and p-type, respectively. Like elements in the drawings are marked with like reference numerals.

First Embodiment

FIG. 1 is a cross-sectional view schematically showing the configuration of a semiconductor apparatus according to a first embodiment of the invention.

On the major surface of a drain layer 2 serving as a first first-conductivity-type semiconductor layer of $n^+$-type silicon having a high impurity concentration, n-type pillar layers 3a of n-type silicon, $n^-$-type pillar layers 3b of $n^-$-type silicon, and p-type pillar layers 4 of p-type silicon are provided.

The n-type pillar layer (second portion) 3a and the $n^-$-type pillar layer (first portion) 3b constitute a second first-conductivity-type semiconductor layer. The p-type pillar layer 4 constitutes a third second-conductivity-type semiconductor layer. The second first-conductivity-type semiconductor layers 3a, 3b and the third second-conductivity-type semiconductor layers 4 are periodically arrayed adjacent (in pn junction) to each other in the lateral direction generally parallel to the major surface of the drain layer 2, constituting a so-called "super-junction structure". The n-type pillar layer 3a and the p-type pillar layer 4 are adjacent to each other by a pn junction. Between the n-type pillar layers 3a, an $n^-$-type pillar layer 3b is provided in contact with the n-type pillar layers 3a.

More specifically, the second first-conductivity-type semiconductor layer provided between a pair of adjacent p-type pillar layers 4 is composed of a pair of n-type pillar layers 3a adjacent (in pn junction) to a pair of p-type pillar layers 4, respectively, and an $n^-$-type pillar layer 3b provided therebetween and having a lower impurity concentration than the n-type pillar layers 3a. Hence the impurity concentration in the second first-conductivity-type semiconductor layer varies in the lateral direction generally parallel to the major surface of the drain layer 2 and is minimized at the lateral center ($n^-$-type pillar layer 3b). The n-type pillar layers 3a sandwiching the p-type pillar layer 4 are connected to each other below the p-type pillar layer 4 to form a concave cross section, and the connecting portion is in contact with the drain layer 2.

The planar pattern of the n-type pillar layers 3a, the $n^-$-type pillar layers 3b, and the p-type pillar layers 4 is illustratively a striped configuration. However, it is not limited thereto, but may be formed in a lattice or staggered configuration.

The semiconductor apparatus according to this embodiment is broadly divided into a cell section (device section) having a periodic array structure (super-junction structure) of the n-type pillar layers 3a, the $n^-$-type pillar layers 3b, and the p-type pillar layers 4, and a termination section surrounding outside the cell section.

On the major surface of the drain layer 2 in the termination section, the periodic array structure (super-junction structure) of the n-type pillar layers 3a, the $n^-$-type pillar layers 3b, and the p-type pillar layers 4 is not provided, but an $n^-$-layer 10 of $n^-$-type silicon is provided as a sixth first-conductivity-type semiconductor layer. The impurity concentration in the $n^-$-layer 10 is lower than or comparable to the concentration at the center of the second first-conductivity-type semiconductor layer, or the $n^-$-type pillar layer 3b.

A base region 5 of p-type silicon is provided as a fourth second-conductivity-type semiconductor region on the p-type pillar layer 4 in the cell section. Like the p-type pillar layer 4, the base region 5 is adjacent to and in pn junction with the n-type pillar layer 3a. A source region 6 of $n^+$-type silicon is selectively provided as a fifth first-conductivity-type semiconductor layer in the surface of the base region 5.

An insulating film 7 is provided on the portion extending from the $n^-$-type pillar layer 3b and the n-type pillar layer 3a through the base region 5 to the source region 6. The insulating film 7 is illustratively a silicon oxide film having a thickness of approximately 0.1 µm. A control electrode (gate electrode) 8 is provided on the insulating film 7.

A source electrode 9 is provided as a second main electrode on part of the source regions 6 and the portion of the base region 5 between the source regions 6. The source electrode 9 is in contact with and electrically connected to the source region 6 and the base region 5. At the surface opposite to the major surface of the drain layer 2, a drain electrode 1 is provided as a first main electrode and electrically connected to the drain layer 2.

In the surface of the n$^-$-layer 10 in the termination section, a guard ring layer 11 of p-type silicon is formed as a seventh second-conductivity-type semiconductor layer. While the figure shows a plurality of guard ring layers 11, a single guard ring layer 11 may be used instead. The surface of the n$^-$-layer 10 and the guard ring layer 11 is covered with a field insulating film 12 illustratively made of silicon oxide. By forming a guard ring layer 11 in the surface of the termination section, electric field concentration at the edge of the outermost base region 5a is prevented to realize a high breakdown voltage.

Field stop layers 14 to 17 are formed on the major surface of the drain layer 2 in the outermost portion of the termination section so that the depletion layer does not reach the dicing line upon application of high voltage. The field stop layers 14 to 17 can be formed simultaneously with the n-type pillar layer 3a, the p-type pillar layer 4, the p-type base region 5, and the n-type source region 6 in the cell section. More specifically, in that case, the field stop layer 16 is made of n-type silicon formed simultaneously with the n-type pillar layer 3a, the field stop layer 17 is made of p-type silicon formed simultaneously with the p-type pillar layer 4, the field stop layer 15 is made of p-type silicon formed simultaneously with the p-type base region 5, and the field stop layer 14 is made of n-type silicon formed simultaneously with the n-type source region 6.

The pillar-shaped n-type field stop layer 16 serving as a ninth first-conductivity-type semiconductor layer is formed simultaneously with the second first-conductivity-type semiconductor layer 3a, and hence they have a similar impurity concentration profile. Thus the impurity concentration in the n-type field stop layer 16 is maximized in the vicinity of the junction with the p-type field stop layer 17 and equal to the concentration in the n-type pillar layer 3a near the junction with the p-type pillar layer 4. While the figure shows the pillar-shaped field stop layer 16, 17 as a single layer, the invention is practicable also when two or more field stop pillar layers are formed.

On the surface of the field stop layers 14, 15, a field stop electrode 13 is provided in contact therewith. The field stop electrode 13 can be also formed simultaneously with the source electrode 9.

In this embodiment, the super-junction structure of the second first-conductivity-type semiconductor layers 3a, 3b and the third second-conductivity-type semiconductor layers 4 is provided only in the cell section, and not provided in the termination section. The termination section includes an n$^-$-layer 10 having an impurity concentration lower than or comparable to the concentration at the lateral center, or the n$^-$-type pillar layer 3b, of the second first-conductivity-type semiconductor layer 3a, 3b. Thus the depletion layer easily extends in the termination section, and a higher termination breakdown voltage than in the cell section can be realized. Hence avalanche breakdown occurs in the cell section, allowing a large avalanche current to flow therein. That is, a high avalanche withstand capability can be obtained.

Thus, in this embodiment, the cell section has a super-junction structure of the second first-conductivity-type semiconductor layers 3a, 3b and the third second-conductivity-type semiconductor layers 4 to realize low ON resistance. On the other hand, the termination section includes an n$^-$-layer 10 having a low impurity concentration to obtain a higher breakdown voltage than in the cell section, and a high avalanche withstand capability can be realized.

Such a structure can be formed, as described below with reference to FIG. 2, by forming a trench T1 in an n$^-$-layer 10 having a low impurity concentration and forming an n-type pillar layer 3a and a p-type pillar layer 4 in the trench T1. Thus a super-junction structure can be formed only in the cell section, with the termination section made of the n$^-$-layer 10.

Figure 2A:
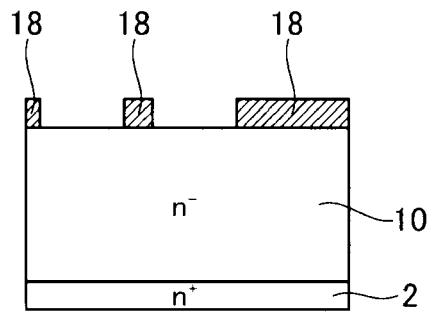
FIGS. 2A to 2E are process flow charts showing a method of manufacturing a semiconductor apparatus according to the first embodiment of the same.
Figure 2B:
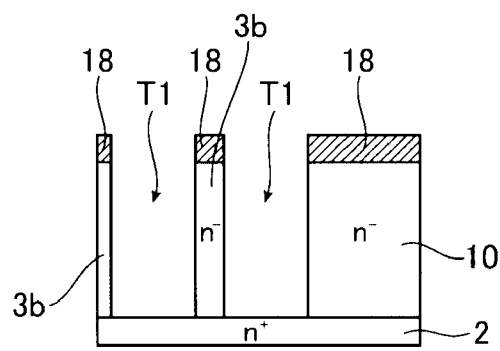

This process is specifically described in the following. First, as shown in FIG. 2A, on the surface of an n$^-$-layer 10 crystal-grown on an n$^+$-type drain layer (substrate) 2, a resist or oxide film is selectively formed as a mask 18. As shown in FIG. 2B, trenches T1 are formed by RIE (reactive ion etching), for example. The n$^-$-layer 10 is left in the termination section, and an n$^-$-type pillar layer 3b is left between the trenches T1 in the cell section.

Figure 2C:
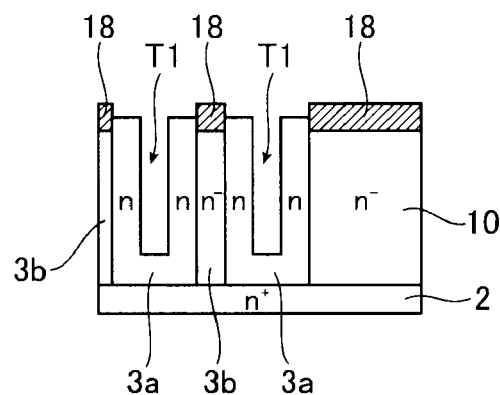
Figure 2D:
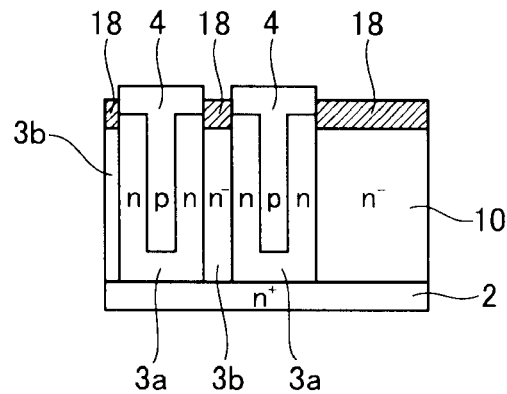

Next, as shown in FIG. 2C, the trench T1 is filled in with an n-type pillar layer 3a. Subsequently, before the trench T1 is completely filled, as shown in FIG. 2D, a p-type pillar layer 4 is buried therein. Thus an n-type pillar layer 3a having a concave cross section and a p-type pillar layer 4 buried therein are formed in the trench T1.

Figure 2E:
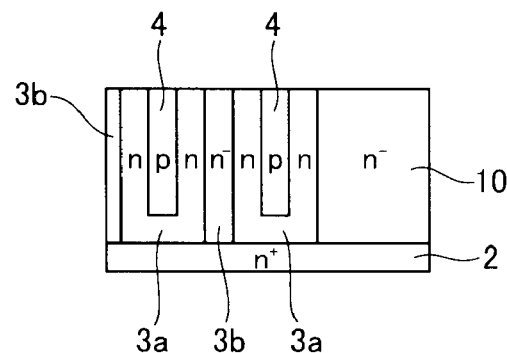

Then the surface is planarized by CMP (chemical mechanical polishing). Thus, as shown in FIG. 2E, the structure with the n-type pillar layers 3a, the n$^-$-type pillar layers 3b, and the p-type pillar layers 4 repeated laterally is exposed to the surface of the cell section. Then, by forming a MOS gate structure on the surface, a semiconductor apparatus shown in FIG. 1 is obtained.

In a conventional method for obtaining a super-junction structure based on trench formation, a trench is formed in an n-type semiconductor layer and filled in with a p-type semiconductor layer to obtain a super-junction structure. In this case, unless the trench is formed also in the termination section, an n-type layer having the same concentration as the n-type pillar layer in the cell section is left in the termination section, failing to obtain high breakdown voltage. For this reason, the super-junction structure is inevitably formed also in the termination section. Hence electric field concentration is likely to occur in the termination section, and it is difficult to obtain a higher breakdown voltage than in the cell section.

In contrast, in this embodiment, by forming both the n-type pillar layer 3a and the p-type pillar layer 4 in one trench T1 by buried growth, the termination section can be formed as an n$^-$-layer 10 having a low concentration. Thus a termination breakdown voltage higher than in the cell section can be obtained. In order to obtain a high termination breakdown voltage, it is preferable that the impurity concentration in the n$^-$-layer 10 be approximately ⅟50 to ⅟10 of that in the n-type pillar layer 3a.

In the structure formed by the above process, the n$^-$-type pillar layer 3b is left like a mesa in the cell section, and this n$^-$-type pillar layer 3b in combination with the n-type pillar layer 3a buried in the trench T1 constitutes one n-type pillar layer corresponding to one p-type pillar layer 4, with the impurity concentration decreased at the lateral center of the n-type pillar layer. That is, in terms of the operation of the super-junction structure, the n-type pillar layer 3a and the n$^-$-type pillar layer 3b operate in combination as one n-type pillar layer.

At the boundary between the super-junction structure of the cell section and the n$^-$-layer 10 of the termination section, the width of the pillar located at the outermost periphery must be half the width of the central pillar. Otherwise, the breakdown voltage would decrease due to imbalance in the amount of impurities between the n-type pillar layer and the p-type pillar layer. In this regard, as a necessary consequence of the process shown in this embodiment, the n-type pillar layer 3a and the p-type pillar layer 4 located at the outermost periphery are formed in one trench T1 symmetrically with respect to the center of the trench T1. That is, the width of the n-type pillar layer 3a located at the outermost periphery, which is formed along one sidewall of the trench T1, is half the width of the two n-type pillar layers 3a between the p-type pillar layers 4 in the cell center portion. Hence the breakdown voltage does not decrease at the boundary between the cell section and the termination section.

As described above, the structure shown in this embodiment can realize a high avalanche withstand capability in a super-junction MOSFET having low ON resistance.

Figure 3:
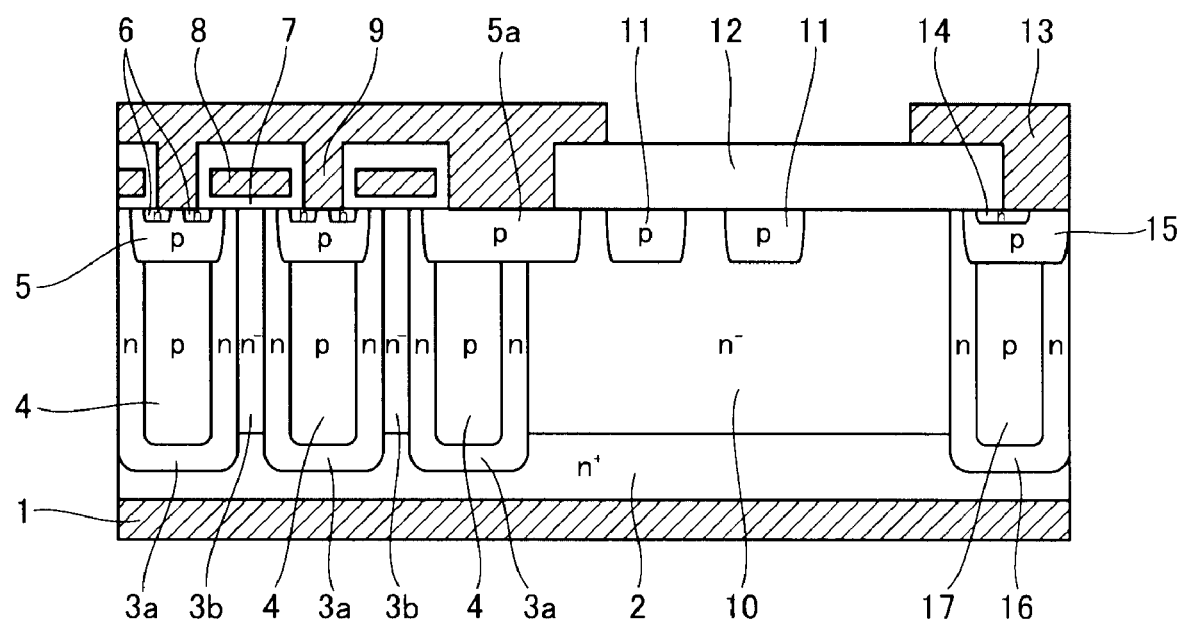
FIG. 3 is a cross-sectional view schematically showing a variation of the semiconductor apparatus according to the first embodiment of the same.

The above embodiment can be practiced also when the etching for forming the trench T1 does not stop at the boundary between the n$^-$-layer 10 and the drain layer 2. If the n-type pillar layer 3a is formed in contact with the drain layer 2, the ON resistance remains unchanged. Hence, as shown in FIG. 3, the invention is practicable also when a trench and an n-type pillar layer 3a buried at the bottom of the trench are formed to extend below the surface of the drain layer 2.

Figure 4:
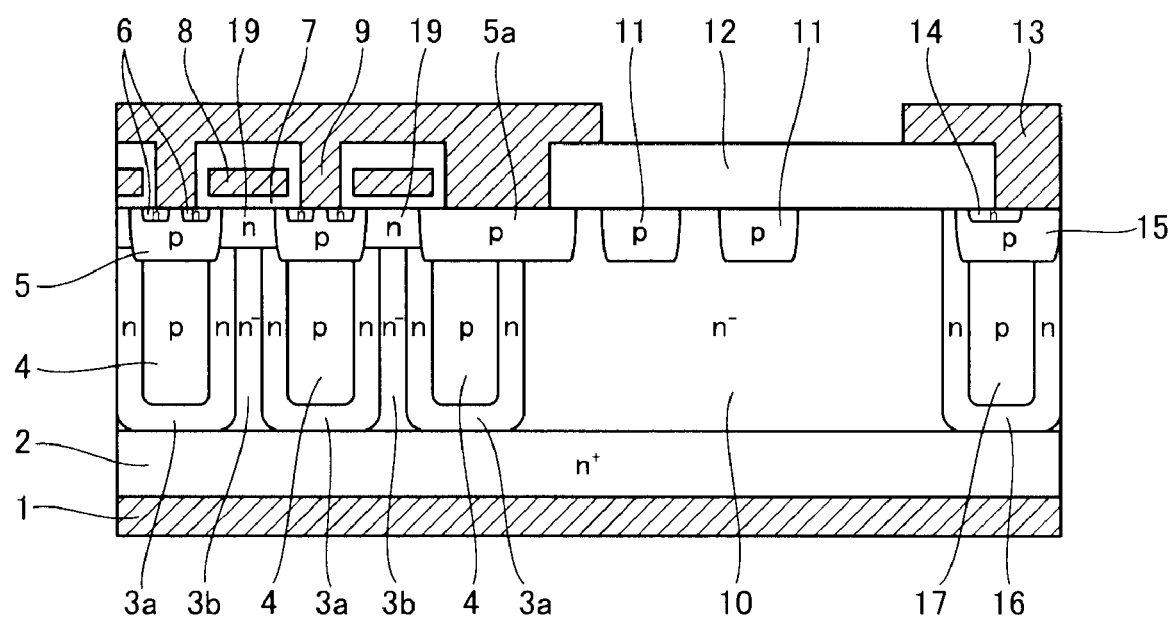
FIG. 4 is a cross-sectional view schematically showing another variation of the semiconductor apparatus according to the first embodiment of the same.

It may be desirable to reduce the resistance of the JFET (junction field-effect transistor) region between the base regions 5 so that electrons flow from the source electrode 9 and the source region 6 to the n-type pillar layer 3a through an n-channel formed in the surface of the base region 5 opposed to the control electrode 8 across the insulating film 7. Hence, as shown in FIG. 4, an n-layer 19 serving as a tenth first-conductivity-type semiconductor layer may be formed between the base regions 5 in the upper portion of the n-type pillar layers 3a and the n$^-$-type pillar layers 3b.

Second Embodiment

Figure 5A:
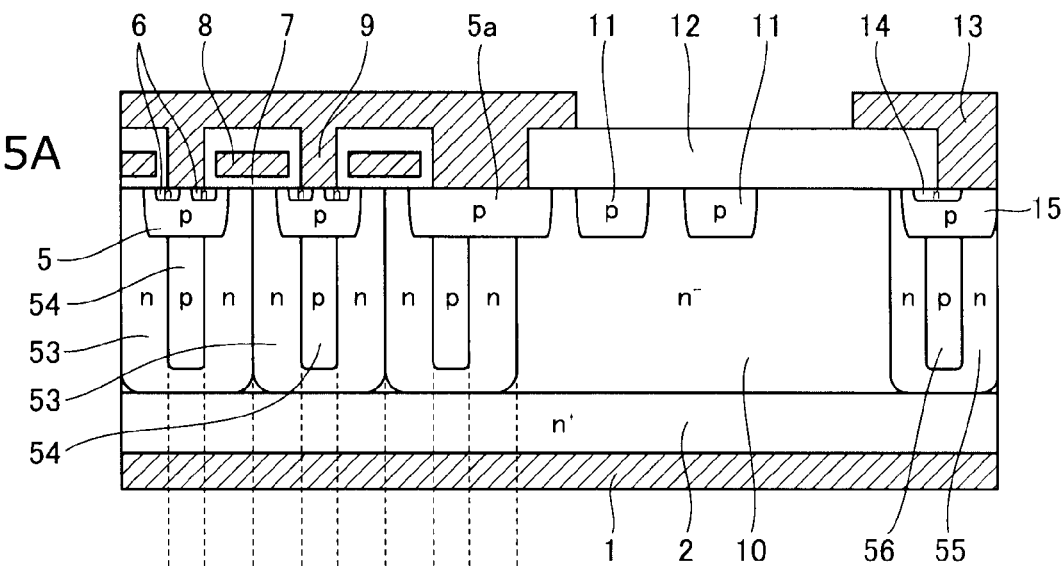
FIGS. 5A and 5B are cross-sectional views schematically showing the configuration of a semiconductor apparatus according to a second embodiment of the invention.
Figure 5B:
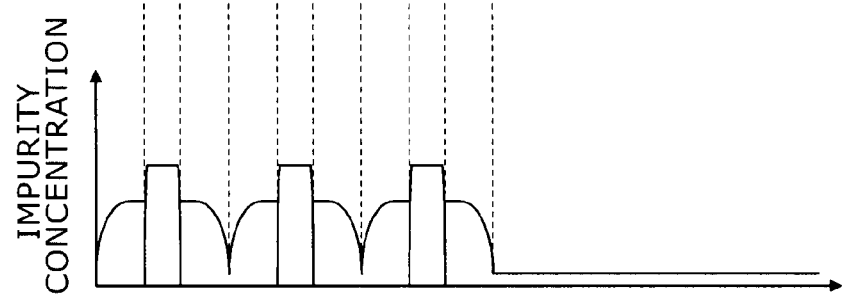

FIG. 5A is a cross-sectional view schematically showing the configuration of a semiconductor apparatus according to a second embodiment of the invention, and FIG. 5B is a schematic view showing the impurity concentration in the n-type pillar layers 53, the p-type pillar layers 54, and the n$^-$-layer 10 in FIG. 5A. In FIG. 5B, the horizontal axis corresponds the lateral position in the cross-sectional structure of FIG. 5A, and the vertical axis represents impurity concentration.

On the major surface of a drain layer 2 in the cell section, n-type pillar layers 53 serving as second first-conductivity-type semiconductor layers and p-type pillar layers 54 serving as third second-conductivity-type semiconductor layers are periodically arrayed adjacent (in pn junction) to each other in the lateral direction generally parallel to the major surface of the drain layer 2, constituting a so-called "super-junction structure".

The n-type pillar layers 53 adjacent (in pn junction) to both side faces of one p-type pillar layer 54 are connected to each other below the p-type pillar layer 54 to form a concave cross section, and the connecting portion is in contact with the drain layer 2. As shown in FIG. 5B, due to the process described below, the impurity concentration in the n-type pillar layer 53 sandwiched between the p-type pillar layers 54 varies in the lateral direction generally parallel to the major surface of the drain layer 2 and is minimized at the lateral center.

Also in this embodiment, as in the first embodiment described above, the cell section has a super-junction structure of the n-type pillar layers 53 and the p-type pillar layers 54 to realize low ON resistance. On the other hand, the termination section includes an n$^-$-layer 10 having a lower impurity concentration than the n-type pillar layers 53 to obtain a higher breakdown voltage than in the cell section, and a high avalanche withstand capability can be realized.

Furthermore, in this embodiment, in contrast to the first embodiment shown in FIG. 1, the cell section does not include n$^-$-type pillar layers 3b. Because of the absence of n$^-$-type pillar layers 3b in the cell section, the average concentration in the portion passing a current is increased, and the ON resistance can be reduced.

The structure of this embodiment can be formed by the process as shown in FIG. 6.

Figure 6A:
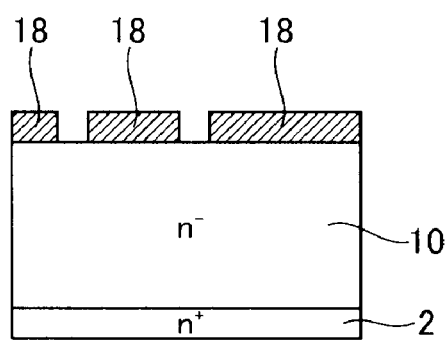
FIGS. 6A to 6E are process flow charts showing a method of manufacturing the semiconductor apparatus according to the second embodiment of the same.
Figure 6D:
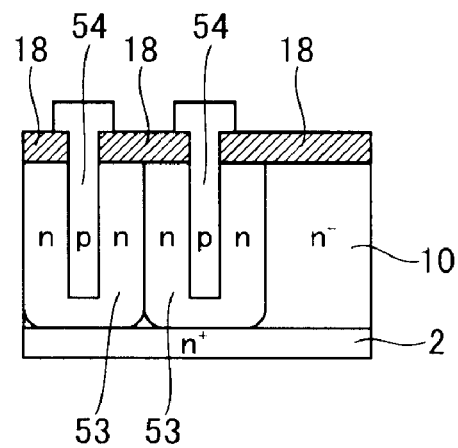
Figure 6B:
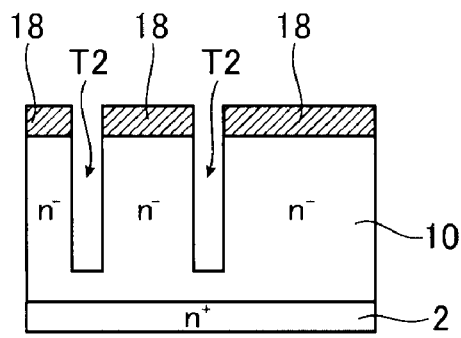

First, as shown in FIG. 6A, on the surface of an n$^-$-layer 10 crystal-grown on an n$^+$-type drain layer (substrate) 2, a resist or oxide film is selectively formed as a mask 18, and trenches T2 are formed by RIE, for example, as shown in FIG. 6B. The n$^-$-layer 10 is left in the termination section.

Figure 6E:
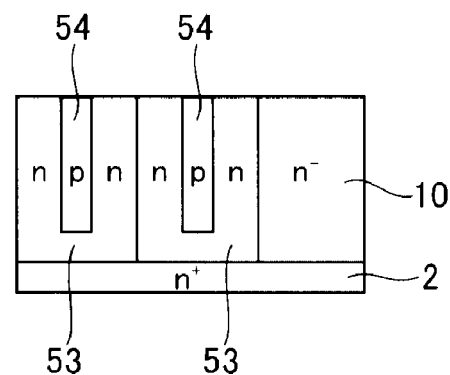
Figure 6C:
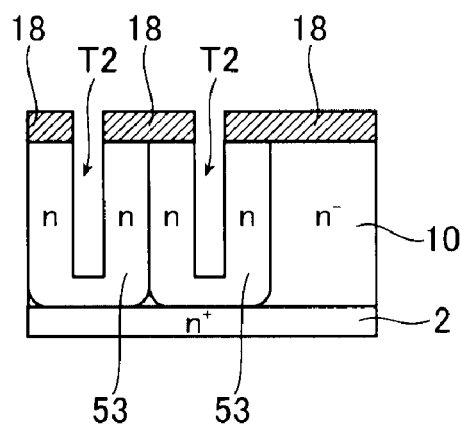

Next, by vapor-phase diffusion, n-type impurities are introduced from the inner wall of the trench T2 into the periphery and bottom of the trench T2 to form an n-type pillar layer 53 at the periphery and bottom of the trench T2 as shown in FIG. 6C. Subsequently, as shown in FIG. 6D, a p-type pillar layer 54 is formed by buried growth in the trench T2. Thus an n-type pillar layer 53 having a concave cross section and a p-type pillar layer 54 buried in the portion surrounded by the n-type pillar layer 53 are formed.

The n-type impurities introduced from the side face of the trench T2 are diffused laterally and brought into contact with the n-type pillar layer 53 diffused from the side face of the adjacent trench T2. Hence, in the n-type pillar layer 53 between the trenches T2, the impurity concentration at the lateral center, where the diffusion distance from the side face of the trench T2 is large, is minimized as shown in FIG. 5B.

In forming the n-type pillar layer, a similar structure can be formed also by filling in the trench T2 with an n-layer followed by solid-phase diffusion in the lateral and downward direction. Alternatively, it can be formed also by ion implantation of n-type impurities into the sidewall of the trench T2 in an oblique direction. Also in the case of forming the n-type pillar layer by these methods, the impurity concentration decreases at the lateral center of the n-type pillar layer.

After the n-type pillar layer 53 and the p-type pillar layer 54 are formed, the surface is planarized by CMP. Thus, as shown in FIG. 6E, the structure with the n-type pillar layers 53 and the p-type pillar layers 54 repeated laterally is exposed to the surface of the cell section. Then, by forming a MOS gate structure on the surface, a semiconductor apparatus shown in FIG. 5 is obtained.

By the above process, also in this embodiment, the termination section can be formed as an n$^-$-layer 10 having a lower concentration than the cell section. Thus a termination breakdown voltage higher than in the cell section can be obtained.

Again, as a necessary consequence of the process of this embodiment, the n-type pillar layer 53 and the p-type pillar layer 54 located at the outermost periphery are formed symmetrically with respect to the center of one trench T2. That is, the width of the n-type pillar layer 53 located at the outermost periphery, which is formed along one side of the trench T2, is necessarily half the width of the n-type pillar layer 53 in the cell center portion. Hence the breakdown voltage does not decrease at the boundary between the cell section and the termination section.

Third Embodiment

Figure 7:
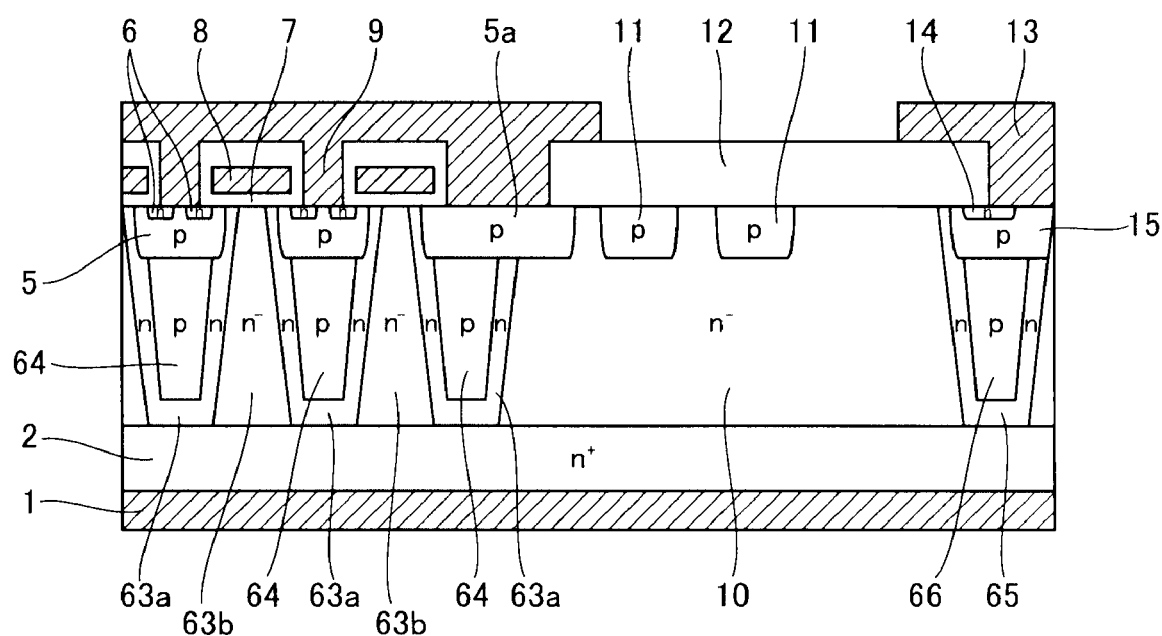
FIG. 7 is a cross-sectional view schematically showing the configuration of a semiconductor apparatus according to a third embodiment of the invention.

FIG. 7 is a cross-sectional view schematically showing the configuration of a semiconductor apparatus according to a third embodiment of the invention.

On the major surface of a drain layer 2, n-type pillar layers 63a, n⁻-type pillar layers 63b, and p-type pillar layers 64 are provided. The n-type pillar layer 63a and the n⁻-type pillar layer 63b constitute a second first-conductivity-type semiconductor layer in this embodiment. The p-type pillar layer 64 constitutes a third second-conductivity-type semiconductor layer. The second first-conductivity-type semiconductor layers 63a, 63b and the third second-conductivity-type semiconductor layers 64 are periodically arrayed adjacent (in pn junction) to each other in the lateral direction generally parallel to the major surface of the drain layer 2, constituting a super-junction structure. The n-type pillar layer 63a and the p-type pillar layer 64 are adjacent to each other by a pn junction. Between the n-type pillar layers 63a, an n⁻-type pillar layer 63b is provided in contact with the n-type pillar layers 63a.

More specifically, the second first-conductivity-type semiconductor layer provided between a pair of adjacent p-type pillar layers 64 is composed of a pair of n-type pillar layers 63a adjacent (in pn junction) to a pair of p-type pillar layers 64, respectively, and an n⁻-type pillar layer 63b provided therebetween and having a lower impurity concentration than the n-type pillar layers 63a. Hence the impurity concentration in the second first-conductivity-type semiconductor layer varies in the lateral direction generally parallel to the major surface of the drain layer 2 and is minimized at the lateral center (n⁻-type pillar layer 63b). The n-type pillar layers 63a sandwiching the p-type pillar layer 64 are connected to each other below the p-type pillar layer 64 to form a concave cross section, and the connecting portion is in contact with the drain layer 2.

In this embodiment, the lateral width of the p-type pillar layer 64 varies in the vertical direction generally perpendicular to the major surface of the drain layer 2. Specifically, the width of the p-type pillar layer 64 gradually increases from the drain electrode 1 toward the source electrode 9.

More specifically, the width of the p-type pillar layer 64 is wide on the source electrode 9 side and narrow on the drain electrode 1 side. Such a structure can be realized by forming, in the step of forming a trench T1 shown in FIG. 2, a trench T1 having a tapered side face with the width of the trench T1 gradually increasing from the drain electrode 1 toward the source electrode 9. This structure decreases electric field on the source side and the drain side, and a higher avalanche withstand capability can be obtained. The fact that the width of the p-type pillar layer 64 varies along the depth translates into local imbalance in the amount of impurities between the n-type pillar layer 63a and the p-type pillar layer 64. Hence, indeed, the cell breakdown voltage decreases. However, because of the low electric field at the upper and lower end of the super-junction structure, negative resistance is unlikely to occur even if a large amount of carriers are generated by avalanche breakdown. Thus a high avalanche withstand capability can be obtained.

It is noted that FIG. 7 shows a structure in which the width of the p-type pillar layer 64 varies vertically. However, a similar effect is obtained also when the impurity concentration in the p-type pillar layer 64 is high on the source side and low on the drain side. Furthermore, because the amount of impurities in the super-junction structure is determined by the product of the pillar width and the impurity concentration, a similar effect of local imbalance in the amount of impurities is obtained if either or both of the pillar width and the concentration varies.

Fourth Embodiment

Figure 8:
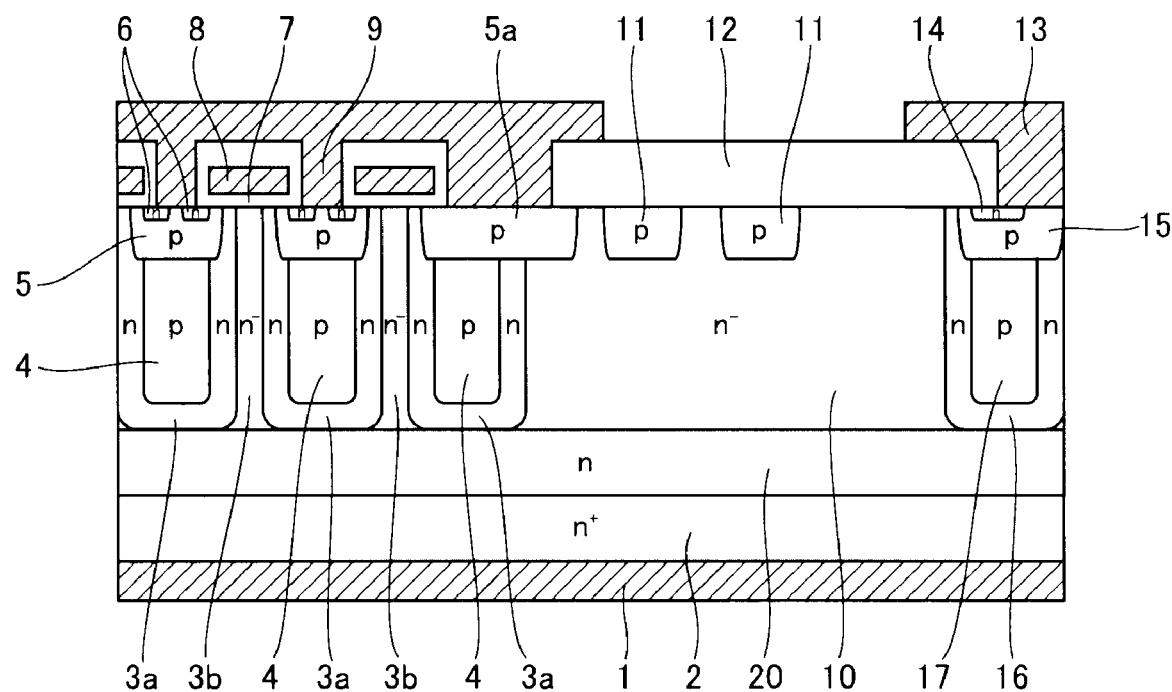
FIG. 8 is a cross-sectional view schematically showing the configuration of a semiconductor apparatus according to a fourth embodiment of the invention.

FIG. 8 is a cross-sectional view schematically showing the configuration of a semiconductor apparatus according to a fourth embodiment of the invention.

This embodiment is different from the first embodiment shown in FIG. 1 in that an n-type buffer layer 20 is interposed as an eighth first-conductivity-type semiconductor layer between the drain layer 2, which is the first first-conductivity-type semiconductor layer, and the second first-conductivity-type semiconductor layer (n-type pillar layer 3a, n⁻-type pillar layer 3b). The impurity concentration in the n-type buffer layer 20 is lower than the average concentration in the second first-conductivity-type semiconductor layer (n-type pillar layer 3a, n⁻-type pillar layer 3b).

This structure can increase the breakdown voltage by the amount of voltage that can be held by the n-type buffer layer 20. Because the n-type buffer layer 20 is gradually depleted upon application of high voltage, the switching waveform and the recovery waveform of the built-in diode are softened.

Figure 9:
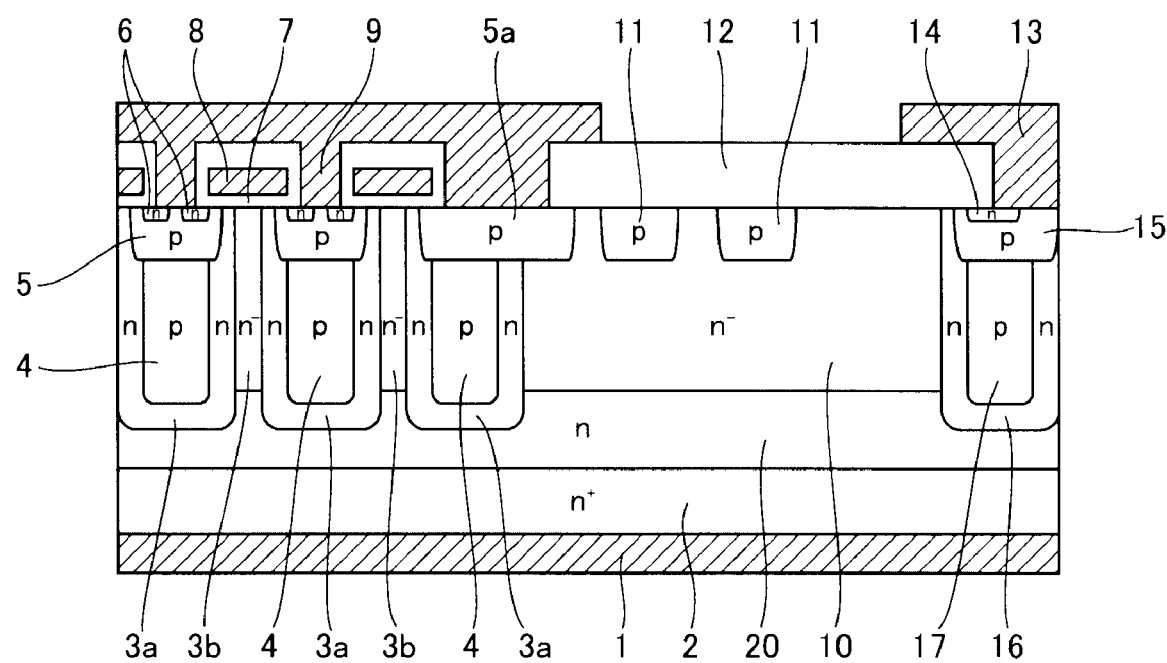
FIG. 9 is a cross-sectional view schematically showing a variation of the semiconductor apparatus according to the fourth embodiment of the same.

While the positional relationship between the n-type buffer layer 20 and the bottom of the n-type pillar layer 3a depends on the etching depth of the trench, the ON resistance remains unchanged if the n-type buffer layer 20 and the n-type pillar layer 3a are in contact with each other. Hence, as shown in FIG. 9, the invention is practicable also when the n-type pillar layer 3a is formed to extend into the n-type buffer layer 20.

Fifth Embodiment

Figure 10:
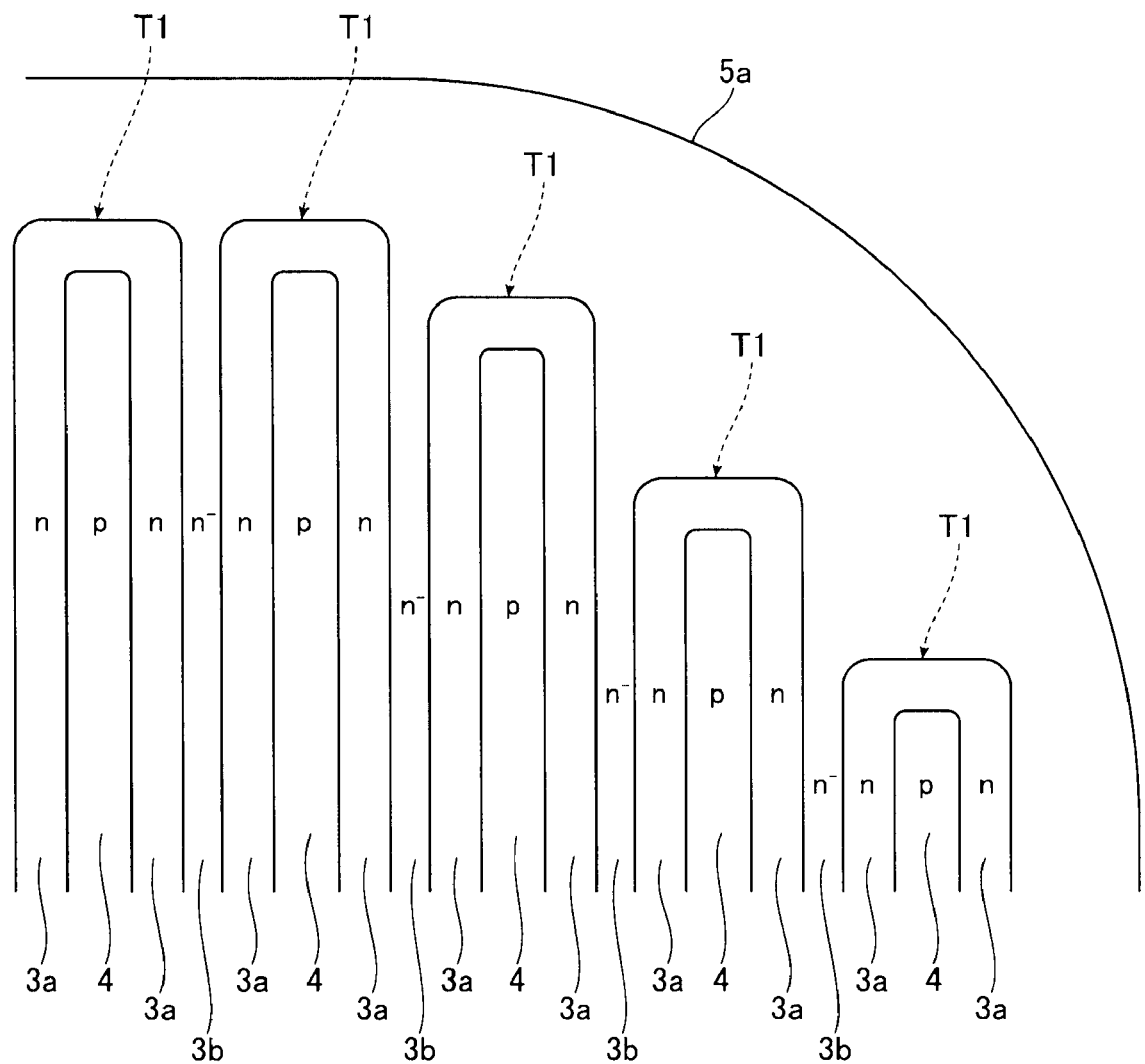
FIG. 10 is a plan view schematically showing the configuration of a semiconductor apparatus according to a fifth embodiment of the invention.

FIG. 10 is a plan view schematically showing the configuration of a semiconductor apparatus according to a fifth embodiment of the invention.

FIG. 10 shows a corner portion of the outermost base region 5a in the structure of FIG. 1. Because electric field concentration is likely to occur at the edge of the outermost base region 5a, the planar pattern is provided with a curvature in an extended area. Here, the super-junction structure also needs to be formed along the curvature.

In this embodiment, the planar pattern of the super-junction structure can be varied by modifying the layout of trenches T1 filled with n-type pillar layers 3a and p-type pillar layers 4. More specifically, the position to form the trench T1 is shifted stepwise along the curvature of the corner portion of the outermost base region 5a so that the super-junction structure can be formed only inside the outermost base region 5a. Because an n-type pillar layer 3a and a p-type pillar layer 4 are formed in one trench T1, if the impurity concentration in the n-type pillar layer 3a and the p-type pillar layer 4 buried in the trench T1 is balanced, an overall balance is also achieved. Thus the trench pattern can be freely designed in terms of impurity concentration balance.

Sixth Embodiment

Figure 11:
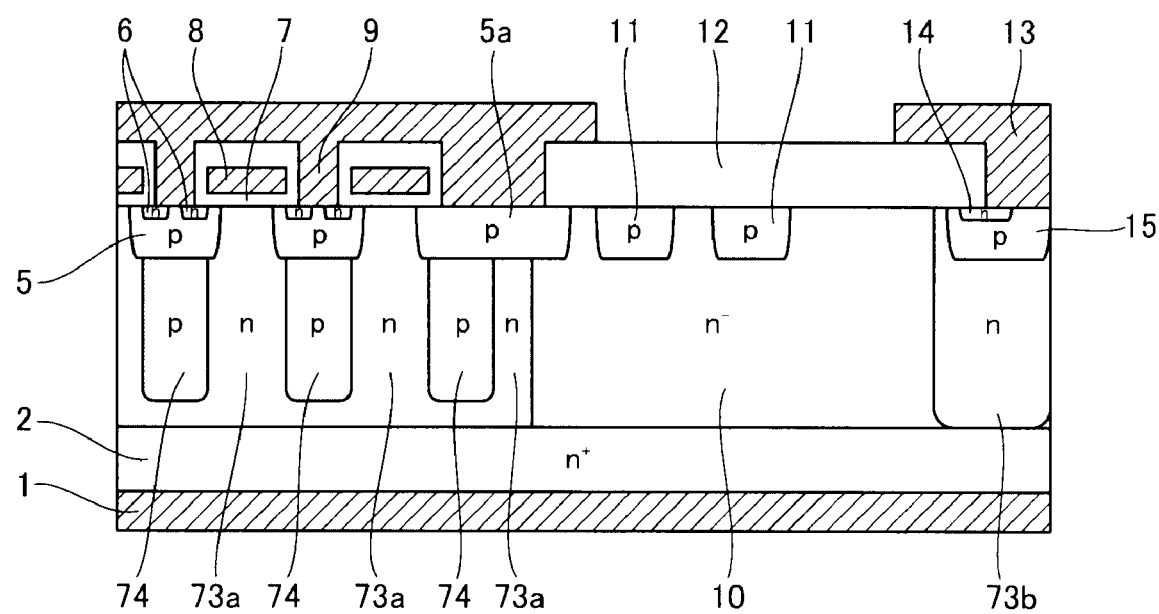
FIG. 11 is a cross-sectional view schematically showing the configuration of a semiconductor apparatus according to a sixth embodiment of the invention.

FIG. 11 is a cross-sectional view schematically showing the configuration of a semiconductor apparatus according to a sixth embodiment of the invention.

On the major surface of a drain layer 2 in the cell section, n-type pillar layers 73a serving as second first-conductivitytype semiconductor layers and p-type pillar layers 74 serving as third second-conductivity-type semiconductor layers are periodically arrayed adjacent (in pn junction) to each other in the lateral direction generally parallel to the major surface of the drain layer 2, constituting a super-junction structure.

The n-type pillar layers 73a adjacent (in pn junction) to both side faces of one p-type pillar layer 74 are connected to each other below the p-type pillar layer 74 to form a concave cross section, and the connecting portion is in contact with the drain layer 2.

Also in this embodiment, the cell section has a super-junction structure of the n-type pillar layers 73a and the p-type pillar layers 74 to realize low ON resistance. On the other hand, the termination section includes an n⁻-layer 10 having a lower impurity concentration than the n-type pillar layers 73a to obtain a higher breakdown voltage than in the cell section, and a high avalanche withstand capability can be realized.

In the structure of this embodiment, the concentration in the n-type pillar layer 73a is constant. This facilitates a uniform flow of current throughout the n-type pillar layer 73a serving as a current path during ON time, and a low ON resistance is easily achieved.

The structure of this embodiment can be formed by the process as shown in FIG. 12.

Figure 12A:
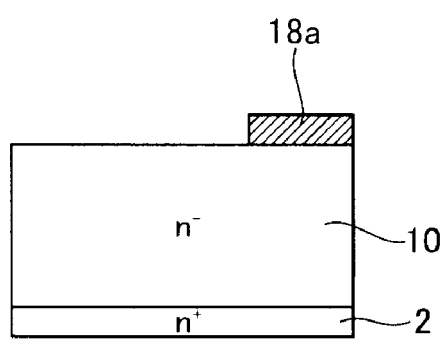
FIGS. 12A to 12F are process flow charts showing a method of manufacturing a semiconductor apparatus according to the sixth embodiment of the same.
Figure 12D:
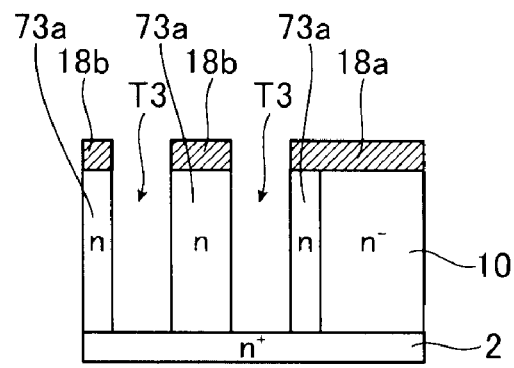
Figure 12B:
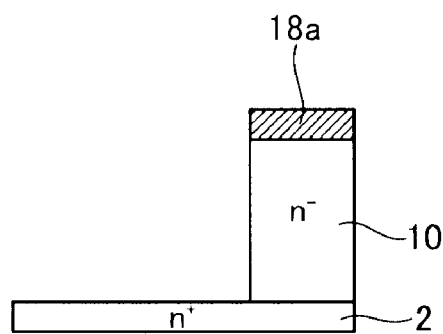

First, as shown in FIG. 12A, on the surface of the termination section of an n⁻-layer 10 crystal-grown on an n⁺-type drain layer (substrate) 2, a resist or oxide film is formed as a mask 18a, and the cell section is entirely etched away (FIG. 12B). The n⁻-layer 10 is left in the termination section.

Figure 12E:
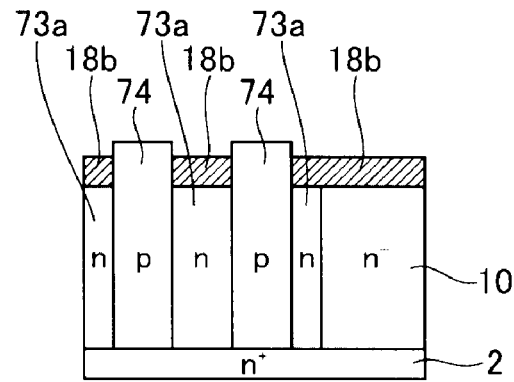
Figure 12C:
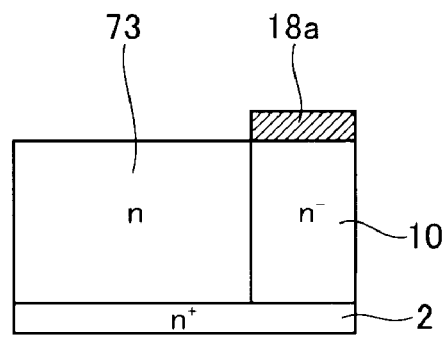

Next, as shown in FIG. 12C, an n-layer 73 is formed by buried growth in the above etched-away portion. Next, on the surface of the n-layer 73, a resist or oxide film is selectively formed as a mask 18b, and trenches T3 are formed by RIE, for example, as shown in FIG. 12D. Thus n-type pillar layers 73a are formed adjacent to the trench T3 in the cell section.

Figure 12F:
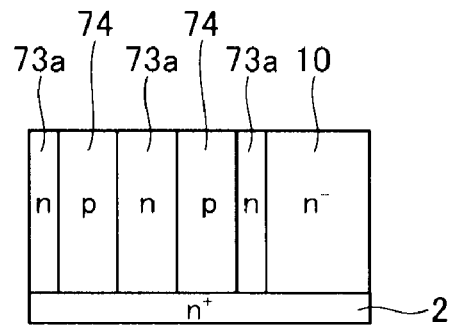

Next, as shown in FIG. 12E, a p-type pillar layer 74 is formed in the trench T3 by buried growth. Then the surface is planarized by CMP. Thus, as shown in FIG. 12F, the structure with the n-type pillar layers 73a and the p-type pillar layers 74 repeated laterally is exposed to the surface of the cell section. Then, by forming a MOS gate structure on the surface, a semiconductor apparatus shown in FIG. 11 is obtained.

The embodiments of the invention have been described with reference to the examples. However, the invention is not limited thereto, but can be variously modified within the spirit of the invention.

For instance, any combinations of the above-described embodiments are included in a scope of the present invention. Further, in the above embodiments, it is assumed that the first conductivity type and the second conductivity type are n-type and p-type, respectively. However, the invention is practicable also when the first conductivity type and the second conductivity type are p-type and n-type, respectively.

The planar pattern of the MOS gate section and the super-junction structure is not limited to the striped configuration, but may be formed in a lattice or staggered configuration.

While the cross sections of the planar gate structure are shown, a trench gate structure may also be used.

The above device termination structures are not limitative. The invention is practicable also for any termination structures such as the field plate structure and the RESURF structure.

In the above description, silicon (Si) is used as the semiconductor in the MOSFETs. However, compound semiconductors such as silicon carbide (SiC) or gallium nitride (GaN), or wide bandgap semiconductors such as diamond can be also used as the semiconductor.

The invention has been described with reference to MOSFETs having a super-junction structure. However, the invention is also applicable to any devices having a super-junction structure, such as an SBD (Schottky barrier diode), a pin diode, and an IGBT (insulated gate bipolar transistor).

The invention claimed is;

1. A semiconductor apparatus comprising:
   a first first-conductivity-type semiconductor layer;
   a second first-conductivity-type semiconductor layer provided on a major surface of the first first-conductivity-type semiconductor layer;
   a third second-conductivity-type semiconductor layer being adjacent to the second first-conductivity-type semiconductor layer, provided on the major surface of the first first-conductivity-type semiconductor layer, and forming a periodic array structure in combination with the second first-conductivity-type semiconductor layer in a lateral direction generally parallel to the major surface of the first first-conductivity-type semiconductor layer;
   a first main electrode electrically connected to the first first-conductivity-type semiconductor layer;
   a fourth second-conductivity-type semiconductor region provided on the third second-conductivity-type semiconductor layer;
   a fifth first-conductivity-type semiconductor region selectively provided in a surface of the fourth second-conductivity-type semiconductor region;
   a second main electrode provided in contact with the fifth first-conductivity-type semiconductor region and the fourth second-conductivity-type semiconductor region;
   a control electrode provided on the fifth first-conductivity-type semiconductor region, the fourth second-conductivity-type semiconductor region, and the second first-conductivity-type semiconductor layer via an insulating film; and
   a sixth first-conductivity-type semiconductor layer provided on the major surface of the first first-conductivity-type semiconductor layer in a termination section outside the periodic array structure of the second first-conductivity-type semiconductor layer and the third second-conductivity-type semiconductor layer,
   the second first-conductivity-type semiconductor layer having an impurity concentration varying in the lateral direction, the impurity concentration being minimized at a center in the lateral direction,
   an impurity concentration in the sixth first-conductivity-type semiconductor layer being not higher than the impurity concentration at the center of the second first-conductivity-type semiconductor layer, and
   the second first-conductivity-type semiconductor layer having lower ends of regions with a higher impurity concentration sandwiching the third second-conductivity-type semiconductor layer and being formed to extend below the major surface of the first first-conductivity-type semiconductor layer.

2. The semiconductor apparatus according to claim 1, wherein a width of the third second-conductivity-type semiconductor layer increases from the first main electrode toward the second main electrode.

3. The semiconductor apparatus according to claim 1, wherein an impurity concentration of the third second-conductivity-type semiconductor layer increases from the first main electrode toward the second main electrode.

4. The semiconductor apparatus according to claim 1, further comprising one or more seventh second-conductivity-type semiconductor layers provided in a surface of the sixth first-conductivity-type semiconductor layer in the termination section.

5. The semiconductor apparatus according to claim 4, wherein the seventh second-conductivity-type semiconductor layers are guard ring layers enclosing the periodic array structure.

6. The semiconductor apparatus according to claim 1, further comprising:
an eighth first-conductivity-type semiconductor layer interposed between the first first-conductivity-type semiconductor layer and the second first-conductivity-type semiconductor layer,
an impurity concentration in the eighth first-conductivity-type semiconductor layer being lower than an average impurity concentration in the second first-conductivity-type semiconductor layer.

7. The semiconductor apparatus according to claim 1, further comprising:
a ninth first-conductivity-type semiconductor layer provided on the major surface of the first first-conductivity-type semiconductor layer in an outermost portion of the termination section,
a peak of an impurity concentration in the ninth first-conductivity-type semiconductor layer being comparable to a peak of the impurity concentration in the second first-conductivity-type semiconductor layer.

8. The semiconductor apparatus according to claim 7, further comprising:
a tenth second-conductivity-type semiconductor layer provided in the ninth first-conductivity-type semiconductor layer.

9. The semiconductor apparatus according to claim 7, further comprising:
an eleventh second-conductivity-type semiconductor layer provided on the ninth first-conductivity-type semiconductor layer.

10. The semiconductor apparatus according to claim 9, further comprising:
a field-stop electrode provided in contact with the eleventh second-conductivity-type semiconductor layer.

11. The semiconductor apparatus according to claim 1, wherein regions with a higher impurity concentration of the second first-conductivity-type semiconductor layer sandwiching the third second-conductivity-type semiconductor layer are connected to each other below the third second-conductivity-type semiconductor layer.

12. The semiconductor apparatus according to claim 1, further comprising a tenth first-conductivity-type semiconductor layer provided between the fourth second-conductivity-type semiconductor regions on the second first-conductivity-type semiconductor layer.

13. A semiconductor apparatus comprising:
a first first-conductivity-type semiconductor layer;
a second first-conductivity-type semiconductor layer provided on a major surface of the first first-conductivity-type semiconductor layer;
a third second-conductivity-type semiconductor layer being adjacent to the second first-conductivity-type semiconductor layer, provided on the major surface of the first first-conductivity-type semiconductor layer, and forming a periodic array structure in combination with the second first-conductivity-type semiconductor layer in a lateral direction generally parallel to the major surface of the first first-conductivity-type semiconductor layer;
a first main electrode electrically connected to the first first-conductivity-type semiconductor layer;
a fourth second-conductivity-type semiconductor region provided on the third second-conductivity-type semiconductor layer;
a fifth first-conductivity-type semiconductor region selectively provided in a surface of the fourth second-conductivity-type semiconductor region;
a second main electrode provided in contact with the fifth first-conductivity-type semiconductor region and the fourth second-conductivity-type semiconductor region;
a control electrode provided on the fifth first-conductivity-type semiconductor region, the fourth second-conductivity-type semiconductor region, and the second first-conductivity-type semiconductor layer via an insulating film;
a sixth first-conductivity-type semiconductor layer provided on the major surface of the first first-conductivity-type semiconductor layer in a termination section outside the periodic array structure of the second first-conductivity-type semiconductor layer and the third second-conductivity-type semiconductor layer;
a seventh first-conductivity-type semiconductor layer provided or the major surface of the first first-conductivity-type semiconductor layer in an outermost portion of the termination section; and
a eighth second-conductivity-type semiconductor layer provided in the seventh first-conductivity-type semiconductor layer,
the second first-conductivity-type semiconductor layer having an impurity concentration varying in the lateral direction, the impurity concentration being minimized at a center in the lateral direction,
an impurity concentration in the sixth first-conductivity-type semiconductor layer being not higher than the impurity concentration at the center of the second first-conductivity-type semiconductor layer, and
a peak of an impurity concentration in the seventh first-conductivity-type semiconductor layer being comparable to a peak of the impurity concentration in the second first-conductivity-type semiconductor layer.

14. A semiconductor apparatus comprising:
a first first-conductivity-type semiconductor layer;
a second first-conductivity-type semiconductor layer provided on a major surface of the first first-conductivity-type semiconductor layer;
a third second-conductivity-type semiconductor layer being adjacent to the second first-conductivity-type semiconductor layer, provided or the major surface of the first first-conductivity-type semiconductor layer, and forming a periodic array structure in combination with the second first-conductivity-type semiconductor layer in a lateral direction generally parallel to the major surface of the first first-conductivity-type semiconductor layer;
a first main electrode electrically connected to the first first-conductivity-type semiconductor layer;
a fourth second-conductivity-type semiconductor region provided on the third second-conductivity-type semiconductor layer;
a fifth first-conductivity-type semiconductor region selectively provided in a surface of the fourth second-conductivity-type semiconductor region;

a second main electrode provided in contact with the fifth first-conductivity-type semiconductor region and the fourth second-conductivity-type semiconductor region;

a control electrode provided on the fifth first-conductivity-type semiconductor region, the fourth second-conductivity-type semiconductor region, and the second first-conductivity-type semiconductor layer via an insulating film;

a sixth first-conductivity-type semiconductor layer provided on the major surface of the first first-conductivity-type semiconductor layer in a termination section outside the periodic array structure of the second first-conductivity-type semiconductor layer and the third second-conductivity-type semiconductor layer; and a seventh first-conductivity-type semiconductor layer being provided between the fourth second-conductivity-type semiconductor regions on the second first-conductivity-type semiconductor layer, the second first-conductivity-type semiconductor layer having an impurity concentration varying in the lateral direction, the impurity concentration being minimized at a center in the lateral direction, and an impurity concentration in the sixth first-conductivity-type semiconductor layer being not higher than the impurity concentration at the center of the second first-conductivity-type semiconductor layer.

* * * * *